US011094738B2

(12) United States Patent
Zhao et al.

(10) Patent No.: US 11,094,738 B2
(45) Date of Patent: Aug. 17, 2021

(54) PHOTOELECTRIC DETECTOR, MANUFACTURING METHOD THEREOF, AND DETECTION DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Haisheng Zhao, Beijing (CN); Hongxi Xiao, Beijing (CN); Jiapeng Li, Beijing (CN); Huigang Jiang, Beijing (CN); Xiaoguang Pei, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 112 days.

(21) Appl. No.: 16/507,171

(22) Filed: Jul. 10, 2019

(65) Prior Publication Data

US 2020/0052031 A1     Feb. 13, 2020

(30) Foreign Application Priority Data

Aug. 9, 2018   (CN) .......................... 201810903417.7

(51) Int. Cl.
*H01L 27/146*     (2006.01)
*G01N 23/205*     (2018.01)

(52) U.S. Cl.
CPC ..... *H01L 27/14689* (2013.01); *G01N 23/205* (2013.01); *H01L 27/1461* (2013.01);
(Continued)

(58) Field of Classification Search
CPC .......... H01L 27/14689; H01L 27/1461; H01L 27/14616; H01L 27/14636;
(Continued)

(56) References Cited

U.S. PATENT DOCUMENTS

2004/0101100 A1*   5/2004   Morii ................ H01L 27/14658
378/98.7
2007/0278606 A1   12/2007   Sasagawa et al.
(Continued)

FOREIGN PATENT DOCUMENTS

CN       101944550 A       1/2011
CN       102082189 A       6/2011
(Continued)

OTHER PUBLICATIONS

First Office Action for Chinese Application No. 201810903417.7, dated Mar. 27, 2020, 8 Pages.
(Continued)

*Primary Examiner* — Blake C Riddick
(74) *Attorney, Agent, or Firm* — Brooks Kushman P.C.

(57) ABSTRACT

The embodiments of the present disclosure provide a photoelectric detector, a method for manufacturing the photoelectric detector, and a detection device. The method for manufacturing the photoelectric detector includes: forming a thin film transistor array layer on a base substrate; forming an organic layer on a side of the thin film transistor array layer facing away from the base substrate; and patterning the organic layer to form a first via hole which enables a signal transmission layer in the thin film transistor array layer to be exposed; and depositing a photoelectric conversion device in the first via hole.

20 Claims, 4 Drawing Sheets

(52) U.S. Cl.
CPC .. *H01L 27/14616* (2013.01); *H01L 27/14636* (2013.01); *H01L 27/14663* (2013.01); *G01N 2223/401* (2013.01); *G01N 2223/505* (2013.01)

(58) Field of Classification Search
CPC ............ H01L 27/14663; G01N 23/205; G01N 2223/401; G01N 2223/505
See application file for complete search history.

(56) References Cited

U.S. PATENT DOCUMENTS

| | | | |
|---|---|---|---|
| 2008/0302969 A1* | 12/2008 | Jung | H01L 27/14663 250/370.09 |
| 2009/0085076 A1 | 4/2009 | Lan et al. | |
| 2010/0059804 A1* | 3/2010 | Hayashi | H01L 27/14692 257/292 |
| 2011/0001051 A1 | 1/2011 | Tanaka | |
| 2011/0127593 A1* | 6/2011 | Hayashi | H01L 27/14663 257/292 |
| 2012/0299070 A1* | 11/2012 | Yamada | H01L 27/14663 257/291 |
| 2013/0048862 A1* | 2/2013 | Nakatsugawa | G01T 1/2018 250/366 |
| 2014/0034950 A1* | 2/2014 | Li | H01L 27/14658 257/53 |
| 2014/0103347 A1* | 4/2014 | Ishino | H01L 27/14689 257/59 |
| 2015/0378032 A1 | 12/2015 | Guo et al. | |
| 2016/0359075 A1* | 12/2016 | Zhao | H01L 31/105 |
| 2017/0092673 A1* | 3/2017 | Miyamoto | H01L 27/14609 |
| 2017/0186809 A1* | 6/2017 | Gao | H01L 29/458 |
| 2017/0236857 A1 | 8/2017 | Bu | |
| 2018/0294294 A1 | 10/2018 | Kim et al. | |

FOREIGN PATENT DOCUMENTS

| | | |
|---|---|---|
| CN | 102157443 A | 8/2011 |
| CN | 103887316 A | 6/2014 |
| CN | 104241436 A | 12/2014 |
| CN | 105140250 A | 12/2015 |
| CN | 105762161 A | 7/2016 |
| CN | 105789226 A | 7/2016 |
| CN | 108140651 A | 6/2018 |
| CN | 108279028 A | 7/2018 |
| WO | 9314418 A1 | 7/1993 |

OTHER PUBLICATIONS

Third Office Action for Chinese Application No. 201810903417.7, dated Feb. 19, 2021, 10 Pages.

* cited by examiner

PHOTOELECTRIC DETECTOR, MANUFACTURING METHOD THEREOF, AND DETECTION DEVICE

CROSS-REFERENCE TO RELATED APPLICATION

This application claims priority to Chinese Patent Application No. 201810903417.7 filed on Aug. 9, 2018, which is incorporated herein by reference in its entirety.

TECHNICAL FIELD

The present disclosure relates to the field of X-ray diffraction technology, in particular to a photoelectric detector, a method for manufacturing the photoelectric detector and a detection device.

BACKGROUND

X-ray diffraction (hereinafter referred to as XRD) is a technique for obtaining material composition, a structure or morphology of atoms or molecules inside the material by irradiating X-rays onto the material and analyzing its diffraction pattern. With the continuous development of XRD technology, more and more XRD products are applied in various fields. The existing XRD product usually operates as follows: it irradiates X-rays, which pass through an object to be detected and onto a scintillator for XRD so that the scintillator emits light to generate an optical signal, and then a photoelectric conversion device in the product converts the optical signal into an electrical signal, and after the electrical signal is transmitted to a chip, the chip analyzes the received electrical signal to obtain an image of the object to be detected.

In the related art, when manufacturing an XRD product, it is common to use a dry-etching process to form a photoelectric conversion device included in the product and then form a resin layer on the photoelectric conversion device. However, such a method for producing the photoelectric conversion device tends to result in some by-products generated in the etching process adhering to sidewalls of the photoelectric conversion device. The by-products are likely to increase leakage current of the photoelectric conversion device, thereby causing a decrease in the yield of the XRD product.

SUMMARY

In a first aspect, embodiments of the present disclosure provide a method for manufacturing a photoelectric detector, including: forming a thin film transistor array layer on a base substrate; forming an organic layer on a side of the thin film transistor array layer facing away from the base substrate; patterning the organic layer to form a first via hole that enables a signal transmission layer in the thin film transistor array layer to be exposed; and forming a photoelectric conversion device in the first via hole by deposition.

According to some embodiments of the present disclosure, when the photoelectric conversion device includes a photodiode, the forming the photoelectric conversion device in the first via hole includes depositing an N-type semiconductor film on a side of the organic layer facing away from the base substrate, and patterning the N-type semiconductor film to obtain an N-type semiconductor layer located in the first via hole; depositing an intrinsic semiconductor film on a side of the N-type semiconductor layer facing away from the base substrate, and patterning the intrinsic semiconductor film to obtain an intrinsic semiconductor layer located in the first via hole; and depositing a P-type semiconductor film on a side of the intrinsic semiconductor layer facing away from the base substrate, and patterning the P-type semiconductor film to obtain a P-type semiconductor layer located in the first via hole.

According to some embodiments of the present disclosure, the forming the thin film transistor array layer on the base substrate includes: forming a gate layer on the base substrate; depositing a first insulating layer on a side of the gate layer facing away from the base substrate to cover the gate layer; forming, on a side of the first insulating layer facing away from the base substrate, a semiconductor layer having an orthogonal projection on the base substrate, which at least partially overlaps an orthogonal projection of the gate layer on the base substrate; forming, on a side of the semiconductor layer facing away from the base substrate, a source layer and a drain layer which are independent of each other, and wherein each of the source layer and the drain layer covers a portion of the semiconductor layer; forming a first passivation layer that completely covers the source layer, the drain layer, and an exposed portion of the semiconductor layer; patterning the first passivation layer to form a second via hole which enables at least a portion of the drain layer to be exposed; and forming a signal transmission layer which includes a first portion filled in the second via hole and a second portion on a side surface of the first passivation layer facing away from the base substrate.

According to some embodiments of the present disclosure, prior to the forming the organic layer, the method further includes forming a buffer layer on the side of the thin film transistor array layer facing away from the base substrate.

According to some embodiments of the present disclosure, the forming the organic layer on the side of the thin film transistor array layer facing away from the base substrate includes forming the organic layer on a side of the buffer layer facing away from the base substrate.

According to some embodiments of the present disclosure, after the photoelectric conversion device has been formed, the method further includes forming a transparent conductive layer on a side surface of the photoelectric conversion device facing away from the base substrate; forming a second passivation layer covering the organic layer and the transparent conductive layer; patterning the second passivation layer to form a third via hole which enables the transparent conductive layer to be exposed; forming a metal layer filled in the third via hole and covering at least a portion of the second passivation layer; and forming a second insulating layer on a side of the metal layer facing away from the base substrate.

According to some embodiments of the present disclosure, the forming the transparent conductive layer on the side surface of the photoelectric conversion device facing away from the base substrate includes depositing an indium tin oxide thin film on the side surface of the photoelectric conversion device facing away from the base substrate by using an indium tin oxide material.

According to some embodiments of the present disclosure, after the second insulating layer has been formed, the method further includes: forming a fourth via hole in the second insulating layer, which enables at least a portion of the metal layer to be exposed; and forming, by a patterning process on a side of the second insulating layer facing away from the base substrate, a transparent common electrode which is electrically connectable to the metal layer through the fourth via hole for supplying a common voltage to the metal layer.

In a second aspect, embodiments of the present disclosure provide a photoelectric detector including: a base substrate; a thin film transistor array layer disposed on the base substrate; an organic layer, disposed on a side of the thin film transistor array layer facing away from the base substrate, and provided with a first via hole which enables a signal transmission layer in the thin film transistor array layer to be exposed; and a photoelectric conversion device disposed in the first via hole.

According to some embodiments of the present disclosure, the photoelectric conversion device includes a photodiode, which includes an N-type semiconductor layer, an intrinsic semiconductor layer and a P-type semiconductor layer sequentially disposed in a direction perpendicular to the base substrate.

According to some embodiments of the present disclosure, the photodiode is a PIN photodiode.

According to some embodiments of the present disclosure, the thin film transistor array layer includes: a gate layer disposed on the base substrate; a first insulating layer covering the gate layer; a semiconductor layer disposed on a side of the first insulating layer facing away from the base substrate, and having an orthogonal projection on the base substrate, which at least partially overlaps an orthogonal projection of the gate layer on the base substrate; a source layer and a drain layer disposed on a side of the semiconductor layer facing away from the base substrate, the source layer and the drain layer being independent of each other, and wherein each of the source layer and the drain layer covers a portion of the semiconductor layer; a first passivation layer disposed on sides of the source layer and the drain layer facing away from the base substrate, and provided with a second via hole which enables at least a portion of the drain layer to be exposed; and a signal transmission layer including a first portion filled in the second via hole and a second portion located on a side surface of the first passivation layer facing away from the base substrate.

According to some embodiments of the present disclosure, the first insulating layer covers at least the gate layer.

According to some embodiments of the present disclosure, the first insulating layer covers an entire region of the base substrate.

According to some embodiments of the present disclosure, the first passivation layer covers at least the source layer, the drain layer, and the semiconductor layer.

According to some embodiments of the present disclosure, the first passivation layer covers an entire region of the base substrate.

According to some embodiments of the present disclosure, the photoelectric detector further includes: a buffer layer disposed between the thin film transistor array layer and the organic layer; a transparent conductive layer disposed on a side surface of the photoelectric conversion device facing away from the base substrate; a second passivation layer covering the organic layer and the transparent conductive layer, and provided with a third via hole which enables the transparent conductive layer to be exposed; a metal layer filled in the third via hole and covering at least a portion of the second passivation layer; and a second insulating layer disposed on a side of the metal layer facing away from the base substrate.

In a third aspect, embodiments of the present disclosure provide a detection device including the photoelectric detector as described in the first aspect.

According to some embodiments of the present disclosure, the detection device is an XRD detection device.

According to some embodiments of the present disclosure, the XRD detection device includes: an X-ray emitting device, configured to emit X-rays; a chip, configured to analyze a received electrical signal to obtain an image of an object to be detected; and a scintillator, configured to receive the X-rays which have passed through the object to be detected in the XRD detection device, wherein the X-rays in the XRD detection device pass through the object to be detected and onto the scintillator in the XRD detection device so that the scintillator emits light to generate an optical signal, and the photoelectric conversion device included in the XRD detection device then converts the optical signal into an electrical signal and transmits it to the signal transmission layer in the thin film transistor array layer included in the XRD detection device, the signal transmission layer further transmits the electrical signal to the chip in the XRD detection device through a thin film transistor, and the chip analyzes the received electrical signal to obtain the image of the object to be detected.

BRIEF DESCRIPTION OF THE DRAWINGS

The drawings described herein are intended to provide a further understanding of the present disclosure, and constitute a part of this disclosure. The illustrative embodiments and description thereof herein are provided merely for explaining the present disclosure, rather than constituting an undue limitation thereof. In the drawing.

| List of Reference Signs | |
|---|---|
| 1: photoelectric detector | 10: base substrate |
| 11: thin film transistor array layer | 110: gate layer |
| 111: first insulating layer | 112: semiconductor layer |
| 113: source layer | 114: drain layer |
| 115: first passivation layer | 116: second via hole |
| 117: signal transmission layer | 12: organic layer |
| 13: first via hole | 14: photoelectric conversion device |
| 140: N-type semiconductor layer | 141: intrinsic semiconductor layer |
| 142: P-type semiconductor layer | 15: buffer layer |
| 16: transparent conductive layer | 17: second passivation layer |
| 18: third via hole | 19: metal layer |
| 20: second insulation layer | 21: by-product |
| 117A: first portion | 117B: second portion |

DETAILED DESCRIPTION

In order to further illustrate the photoelectric detector, the method for manufacturing the photoelectric detector, and the detection device provided by the embodiments of the present disclosure, detailed description will be given hereinafter in conjunction with the accompanying drawings. Here, as a non-limiting example, the photoelectric detector is a backplane used in a display device. However the present disclosure is not limited thereto.

Figure 1:
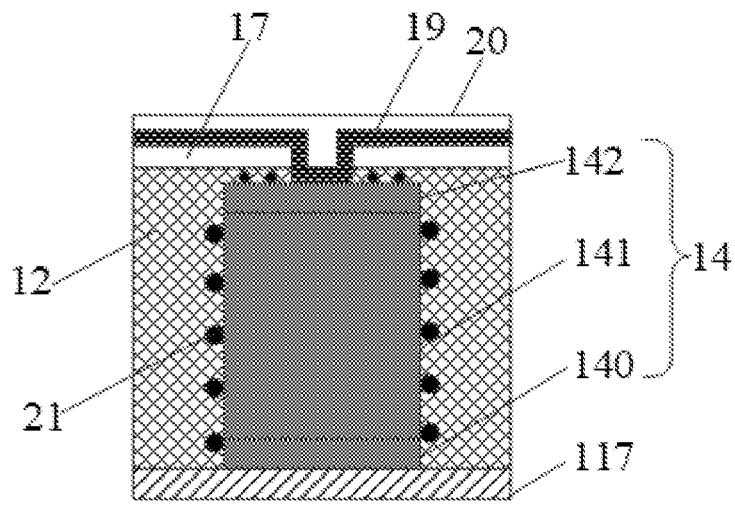
FIG. 1 is a schematic view showing a photoelectric detector manufactured according to related art, in which by-products adhere to a photoelectric conversion device.
Figure 2:
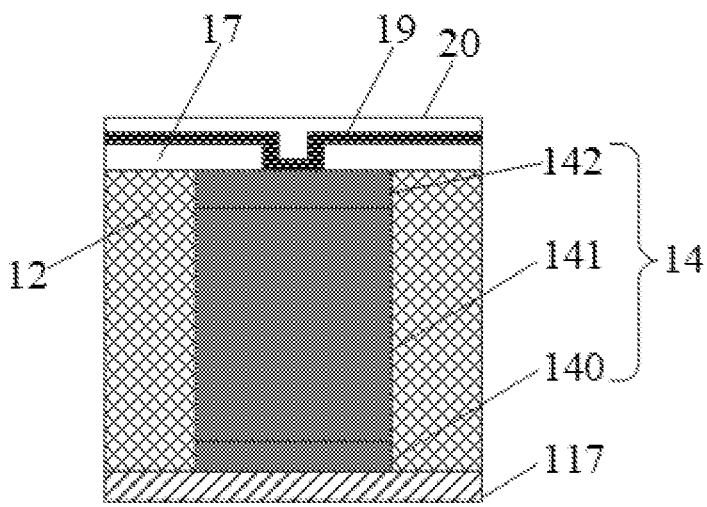
FIG. 2 is a schematic view showing a photoelectric conversion device in a photoelectric detector provided by an embodiment of the present disclosure.

As shown in FIG. 1, in the manufacturing of a photoelectric conversion device in a photoelectric detector in the related art, after a thin film transistor array layer has been formed on a base substrate, the photoelectric conversion device 14 will be formed directly on a signal transmission layer 117 in the thin film transistor array layer by using a dry-etching process. Since the signal transmission layer 117 is usually made of a metal material such as molybdenum, when etching proceeds to a surface of the signal transmission layer 117 in the case of forming the photoelectric conversion device 14 by the dry-etching process, molybdenum in the signal transmission layer 117 will be released by plasma bombardment and adhere to sidewalls and an upper surface of the photoelectric conversion device 14 located above the signal transmission layer 117. This makes it easier for the signal transmission layer 117 and a metal layer 19 which are both connected to the photoelectric conversion device 14 to be short-circuited, thereby causing the photoelectric conversion device 14 to fail.

As can be seen, the photoelectric conversion device 14 formed by the method of the related art tends to have residual by-products generated by etching on its sidewalls and upper surface, which not only easily causes an increase in leakage current of the photoelectric conversion device 14, but also cannot ensure the uniformity of the formed photoelectric conversion device 14. In view of these problems, the present application provides a method for manufacturing a photoelectric detector to better overcome them.

Referring to FIGS. 2 and 3A to 3H, an embodiment of the present disclosure provides a method for manufacturing a photoelectric detector, which includes the following steps.

Figure 3A:
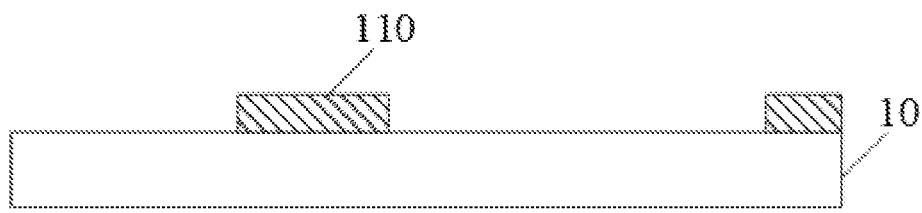
FIGS. 3A to 3H show flowcharts of a method for manufacturing a photoelectric detector provided by an embodiment of the present disclosure.
Figure 3B:
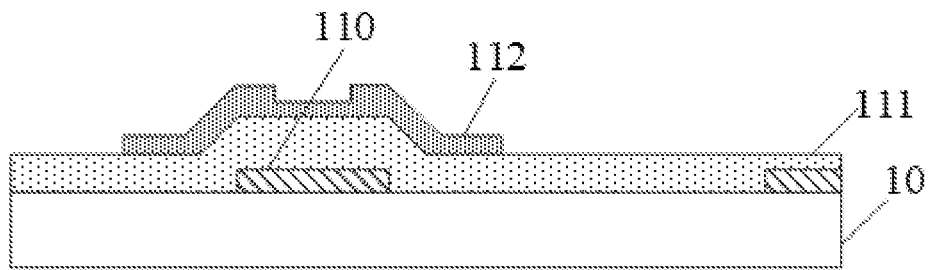
Figure 3C:
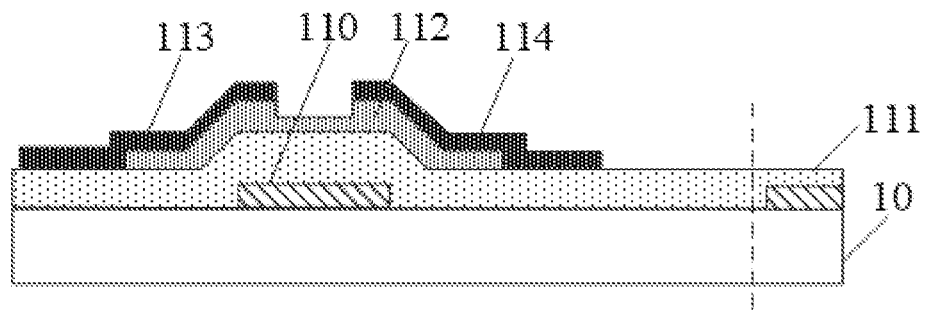
Figure 3D:
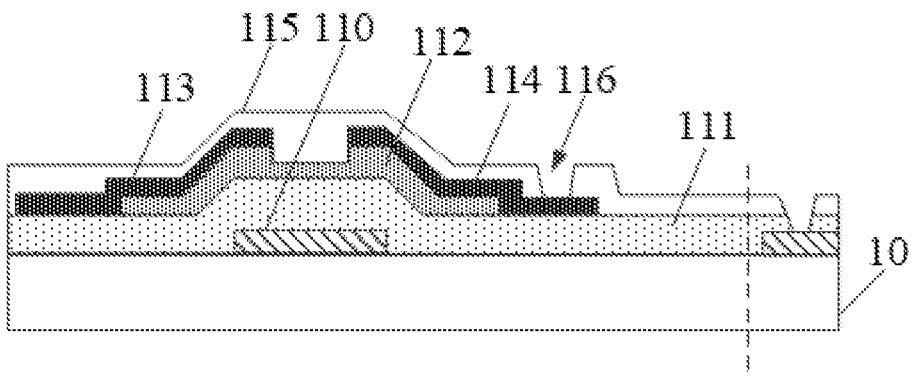
Figure 3E:
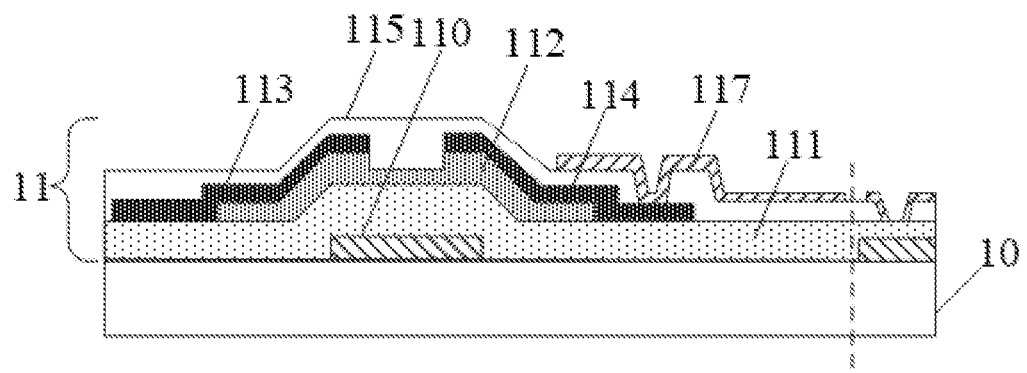

In step 101, a thin film transistor array layer 11 is formed on a base substrate 10, as shown in FIG. 3E.

Specifically, a glass base substrate 10 may be provided, and the thin film transistor array layer 11 is formed on the glass base substrate 10. The thin film transistor array layer 11 includes a plurality of thin film transistors (only one of which is shown in FIG. 3E) for transmitting a received electrical signal to a chip, which then analyzes the electrical signal.

Figure 3F:
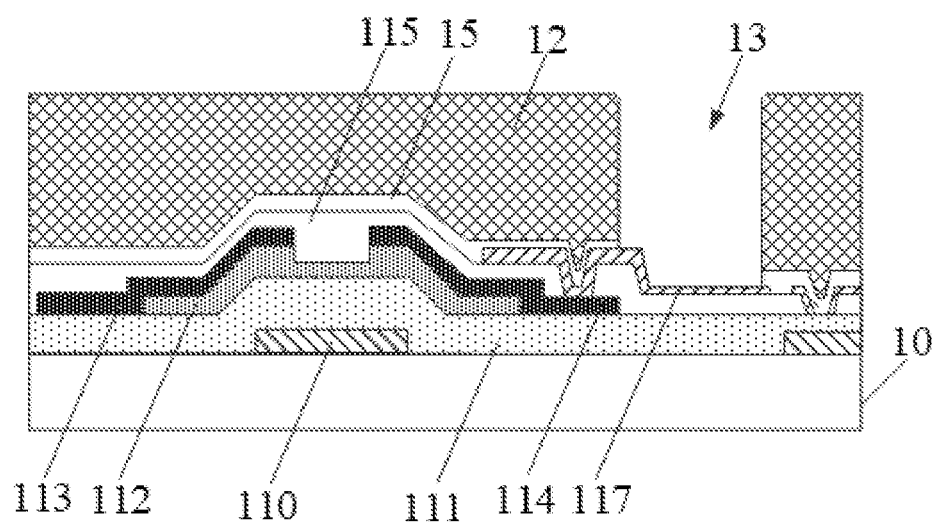

In step 102, an organic layer 12 is formed on a side of the thin film transistor array layer 11 facing away from the base substrate 10, as shown in FIG. 3F.

Specifically, the organic layer 12 may be deposited on the side of the thin film transistor array layer 11 facing away from the base substrate 10 so that it can completely cover the thin film transistor array layer 11. It should be noted that the organic layer 12 may be made of a variety of materials, and by way of example, the organic layer 12 may be made of a resin material.

In step 103, the organic layer 12 is patterned to form a first via hole 13, which enables the signal transmission layer 117 in the thin film transistor array layer 11 to be exposed.

Specifically, the organic layer 12 formed on the thin film transistor array layer is patterned by a patterning process to form the first via hole 13. An orthogonal projection of the first via hole 13 on the base substrate 10 at least partially overlaps an orthogonal projection of the signal transmission layer 117 in the thin film transistor array layer 11 on the base substrate 10, so that the signal transmission layer 117 in the thin film transistor array layer 11 can be exposed through the first via hole 13.

In step 104, the photoelectric conversion device 14 is formed by deposition in the first via hole 13.

Specifically, after the first via hole 13 has been formed, the photoelectric conversion device 14 may be formed by deposition directly in the first via hole 13. The photoelectric conversion device 14 can be connected to the signal transmission layer 117 in the thin film transistor array layer 11, with its sidewalls in direct contact with walls of the first via hole 13, and is configured to convert a received optical signal into an electrical signal and transmit the electrical signal to the signal transmission layer 117 in the thin film transistor array layer 11, which further transmits the electrical signal to the thin film transistor.

When the photoelectric detector manufactured by the method provided by this embodiment of the present disclosure is applied to an XRD detection device, the XRD detection device operates as follows.

X-rays in the XRD detection device pass through an object to be detected and onto a scintillator in the XRD detection device so that the scintillator emits light to generate an optical signal, and the photoelectric conversion device 14 included in the XRD detection device then converts the optical signal into an electrical signal and transmits it to the signal transmission layer 117 in the thin film transistor array layer 11, the signal transmission layer 117 further transmits the electrical signal to a chip in the XRD detection device through a thin film transistor, and the chip analyzes the received electrical signal to obtain an image of the object to be detected.

In the method for manufacturing the photoelectric detector provided by the embodiment of the present disclosure, after the thin film transistor array layer 11 has been formed, the organic layer 12 is formed on the thin film transistor array layer 11, and then patterned to form the first via hole 13, and then the photoelectric conversion device 14 is formed by deposition in the first via hole 13 in such a manner that the formed photoelectric conversion device 14 can be connected to the signal transmission layer 117 in the thin film transistor array layer 11 and sidewalls of the photoelectric conversion device 14 can also be in direct contact with the walls of the first via hole 13. It can be seen that the method provided by the embodiment of the present disclosure consists in directly depositing the photoelectric conversion device 14 in a specified position defined by the via hole, and the sidewalls of the photoelectric conversion device 14 are in direct contact with the walls of the first via hole 13. Therefore, in the process of forming the photoelectric conversion device 14, the first via hole 13 can act to protect the sidewalls of the photoelectric conversion device 14, which not only prevents the by-products generated during the etching process from adhering to the sidewalls of the photoelectric conversion device 14 so as to ensure a low leakage current of the photoelectric conversion device 14, but also solves the problem of the poor uniformity of the photoelectric conversion device 14 due to uneven etching.

Therefore, the method for manufacturing the photoelectric detector provided by the embodiment of the present disclosure not only has a simple manufacturing process, but also enables the photoelectric conversion device 14 in the manufactured photoelectric detector 14 to have high reliability and good uniformity. If the photoelectric detector 1 manufactured by the method provided by the embodiment of the present disclosure is applied to an XRD product, the production yield of the XRD product will be better guaranteed.

Further, the photoelectric conversion device 14 formed in the embodiment described above may have a variety of structures. By way of example, the photoelectric conversion device 14 may be selected as a PIN photodiode. When the photoelectric conversion device 14 is a PIN photodiode, the formation of the photoelectric conversion device 14 in first via hole 13 in the above step 104 may be carried out as follow.

On a side of the organic layer 12 facing away from the base substrate 10 is deposited an N-type semiconductor film, which is then patterned to obtain an N-type semiconductor layer 140 located in the first via hole 13. Specifically, after the formation of the first via hole 13 which enables the signal transmission layer 117 in the thin film transistor array layer 11 to be exposed is completed, on the side of the organic layer 12 facing away from the base substrate 10 is deposited the N-type semiconductor film, which includes a portion deposited in the first via hole 13 and a portion located on a side surface of the organic substance layer 12 facing away from the base substrate 10. Thereafter, a photoresist layer is formed on the N-type semiconductor film, and exposed to form a photoresist retention region, which corresponds to a region where the N-type semiconductor layer 140 is located, that is, the portion of the N-type semiconductor film deposited in the first via hole 13, and a photoresist removal region, which corresponds to a region other than a region where the N-type semiconductor layer 140 is located. Subsequently, the photoresist layer is developed to remove the photoresist layer in the photoresist removal region, and the N-type semiconductor film located in the photoresist removal region is then etched by a dry-etching process to completely remove the N-type semiconductor film in this region. Finally, the photoresist layer in the photoresist retention region is peeled off to complete the formation of the N-type semiconductor layer 140 located in the first via hole 13. The N-type semiconductor layer 140 can be in contact with the signal transmission layer 117 and the walls of the first via hole 13, and the signal transmission layer 117 can function as one of electrodes of the photoelectric conversion device 14 to enable the transmission of the electrical signal to the thin film transistor.

On a side of the N-type semiconductor layer 140 facing away from the base substrate 10 is deposited an intrinsic semiconductor film, which is then patterned to obtain an intrinsic semiconductor layer 141 located in the first via hole 13. Specifically, after the N-type semiconductor layer 140 has been formed, on the side of the N-type semiconductor layer 140 facing away from the base substrate 10 is deposited the intrinsic semiconductor film, which includes a portion deposited in the first via hole 13 and a portion on the side surface of the organic layer 12 facing away from the base substrate 10. Thereafter, a photoresist layer is formed on the intrinsic semiconductor film, and exposed to form a photoresist retention region, which corresponds to a region where the intrinsic semiconductor layer 141 is located, that is, the portion of the intrinsic semiconductor film deposited in the first via hole 13, and a photoresist removal region, which corresponds to a region other than the region where the intrinsic semiconductor layer 141 is located. Subsequently, the photoresist layer is developed to remove the photoresist layer in the photoresist removal region, and the intrinsic semiconductor film located in the photoresist removal region is then etched by a dry-etching process to completely remove the intrinsic semiconductor film in this region. Finally, the photoresist layer in the photoresist retention region is peeled off to complete the formation of the intrinsic semiconductor layer 141 located in the first via hole 13. The intrinsic semiconductor layer 141 includes an N-type semiconductor having a very low concentration, and the introduction of such an intrinsic semiconductor layer 141 is conducive to shortening the diffusion process of carriers.

On a side of the intrinsic semiconductor layer 141 facing away from the base substrate 10 is deposited a P-type semiconductor film, which is then patterned to obtain a P-type semiconductor layer 142 located in the first via hole 13. Specifically, after the intrinsic semiconductor layer 141 has been formed, on the side of the intrinsic semiconductor layer 141 facing away from the base substrate 10 is deposited the P-type semiconductor film, which includes a portion deposited in the first via hole 13, and a portion on the side surface of the organic layer 12 facing away from the base substrate 10. Thereafter, a photoresist layer is formed on the P-type semiconductor film, and exposed to form a photoresist retention region, which corresponds to a region where the P-type semiconductor layer 142 is located, that is, the portion of the P-type semiconductor film deposited in the first via hole 13, and a photoresist removal region, which corresponds to a region other than the region where the P-type semiconductor layer 142 is located. Subsequently, the photoresist layer is developed to remove the photoresist layer in the photoresist removal region, and the P-type semiconductor film located in the photoresist removal region is then etched by a dry-etching process to completely remove the P-type semiconductor film in this region. Finally, the photoresist layer in the photoresist retention region is peeled off to complete the formation of the P-type semiconductor layer 142 located in the first via hole 13.

It is to be noted that, as can be seen from the process of forming the photoelectric conversion device 14 as described above, the photoelectric conversion device 14 in the first via hole 13 in the method provided by the embodiment of the present disclosure is formed directly by deposition, without the dry-etching operation in the first via hole 13. Therefore, the sidewalls of the photoelectric conversion device 14 finally formed in the first via hole 13 are protected by the first via hole 13 and does not make contact with gas or plasma during the dry-etching process, thereby ensuring that the formed photoelectric conversion device 14 will not have the by-products generated during the dry-etching process adhered thereon and can have a low leakage current.

In addition, since the PIN photodiode has advantages such as relatively low junction capacitance, short transit time and high sensitivity, the use of a PIN photodiode as the photoelectric conversion device 14 in the photoelectric detector 1 enables an XRD product to have better working performance when the photoelectric detector 1 is applied to the XRD product.

Further, in the above step 101, the forming the thin film transistor array layer 11 on the base substrate 10 specifically includes forming a gate layer 110, a first insulating layer 111, a semiconductor layer 112, a source layer 113 and a drain layer 114, a first passivation layer 115, a second via hole 116, and a signal transmission layer 117, as will be further explained in detail later.

The gate layer 110 is formed on the base substrate 10, as shown in FIG. 3A. Specifically, a gate film is formed on the base substrate 10 by using a metal material, and then patterned to form the gate layer 110.

The first insulating layer 111 is deposited on a side of the gate layer 110 facing away from the base substrate 10 to cover the gate layer 110, as shown in FIG. 3B. Specifically, after the gate layer 110 has been formed, the first insulating layer 111 is deposited on a surface of the gate layer 110 so that the first insulating layer 111 covers at least the gate layer 10. Moreover, the first insulating layer 111 may further cover an entire region of the base substrate 10.

On a side of the first insulating layer 111 facing away from the base substrate 10 is formed the semiconductor layer 112, which has an orthogonal projection on the base substrate 10 that at least partially overlaps an orthogonal projection of the gate layer 110 on the base substrate 10. Specifically, a semiconductor film is deposited on the first insulating layer 111, and then patterned to form the semiconductor layer 112 with its orthogonal projection on the base substrate 10 at least partially overlapping the orthogonal projection of the gate layer 110 on the base substrate 10.

On a side of the semiconductor layer 112 facing away from the base substrate 10, are formed the source layer 113 and the drain layer 114, which are independent of each other, and wherein each of the source layer and the drain layer covers a portion of the semiconductor layer 112, as shown in FIG. 3C. Specifically, a metal film is formed on the side of the semiconductor layer 112 facing away from the base substrate 10 by using a metal material, and then patterned to form the source layer 113 and the drain layer 114, which are independent of each other, and wherein each of the source layer and the drain layer covers a portion of the semiconductor layer 112.

The first passivation layer 115 is then formed to completely cover the source layer 113, the drain layer 114, and an exposed portion of the semiconductor layer 112, as shown in FIG. 3D. Specifically, on sides of the source layer 113 and the drain layer 114 facing away from the base substrate 10, the first passivation layer 115 is formed such that it covers at least the source layer 113, the drain layer 114, and the semiconductor layer 112, and may further cover the entire region of the base substrate 10.

The first passivation layer 115 is patterned to form the second via hole 116 which enables at least a portion of the drain layer 114 to be exposed. Specifically, the first passivation layer 115 is patterned by a patterning process to form the second via hole 16, which has an orthogonal projection of the second via hole 16 on the base substrate 10 that at least partially overlaps an orthogonal projection of the drain layer 114 on the base substrate 10, so that at least a portion of the drain layer 114 can be exposed through the second via hole 116.

The signal transmission layer 117 is formed to include a first portion 117A filled in the second via hole 116 and a second portion 117B on a side surface of the first passivation layer 115 facing away from the base substrate 10, as shown in FIG. 3E. Specifically, after the second via hole 116 has been formed, a metal film can be further formed on the side surface of the first passivation layer 115 facing away from the base substrate 10 by using a metal material, and then patterned to form the signal transmission layer 117. The signal transmission layer 117 includes the first portion 117A filled in the second via hole 116, and the second portion 117B located on the side surface of the first passivation layer 115 facing away from the base substrate 10, which are connected to each other.

Further, before the organic layer 12 is formed, the method provided by the above embodiment further includes: forming a buffer layer 15 on the side of the thin film transistor array layer 11 facing away from the base substrate 10. The forming the organic layer 12 on the side of the thin film transistor array layer 11 facing away from the base substrate 10 specifically includes: forming the organic layer 12 on a side of the buffer layer 15 facing away from the base substrate 10.

Specifically, after the thin film transistor array layer 11 is formed on the base substrate 10 and before the organic layer 12 is formed, the buffer layer 15 may be formed on the side of the thin film transistor array layer 11 facing away from the base substrate 10, and then the organic layer 12 is formed on the side of the layer 15 facing away from the base substrate 10.

By introducing the buffer layer 15 between the thin film transistor array layer 11 and the organic layer 12, a stress between the thin film transistor array layer 11 and the organic layer 12 can be better released, thereby further prolonging the service life of the photoelectric detector 1.

Further, after the photoelectric conversion device 14 has been formed, the method provided by the above embodiment further includes forming a transparent conductive layer 16, a second passivation layer 17, a third via hole 18, a metal layer 19, a second insulating layer 20, and a fourth via hole, as will be further explained in detail later.

Figure 3G:
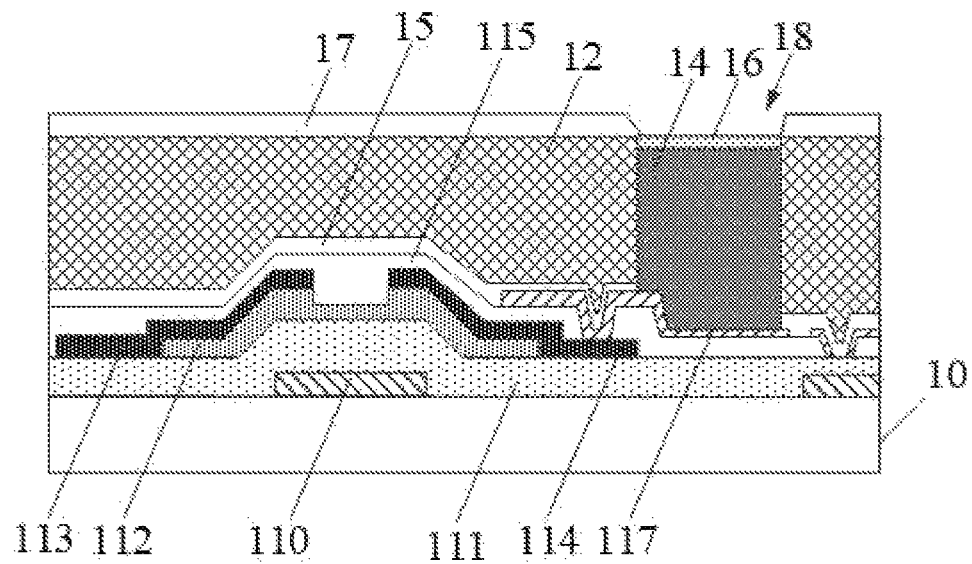

The transparent conductive layer 16 is formed on a side surface of the photoelectric conversion device 14 facing away from the base substrate 10, as shown in FIG. 3G. Specifically, an indium tin oxide film may be deposited on the side of the photoelectric conversion device 14 facing away from the base substrate 10 by using an indium tin oxide material, and then patterned to form the transparent conductive layer 16. It is to be noted that the transparent conductive layer 16 can serve as the other electrode of the photoelectric conversion device 14.

The second passivation layer 17 is formed to cover the organic layer 12 and the transparent conductive layer 16. More specifically, the second passivation layer 17 is formed on a side of the transparent conductive layer 16 facing away from the base substrate 10, and covers at least the organic layer 12 and the transparent conductive layer 16, and may further cover the entire region of the base substrate 10.

The second passivation layer 17 is patterned to form a third via hole 18, which allows the transparent conductive layer 16 to be exposed. Specifically, the second passivation layer 17 is patterned by a patterning process to form the third via hole 18 therein, which has an orthogonal projection of the third via hole 18 on the base substrate 10 that at least partially overlaps an orthogonal projection of the transparent conductive layer 16 on the base substrate 10, so that the transparent conductive layer 16 can be exposed through the third via hole 18.

Figure 3H:
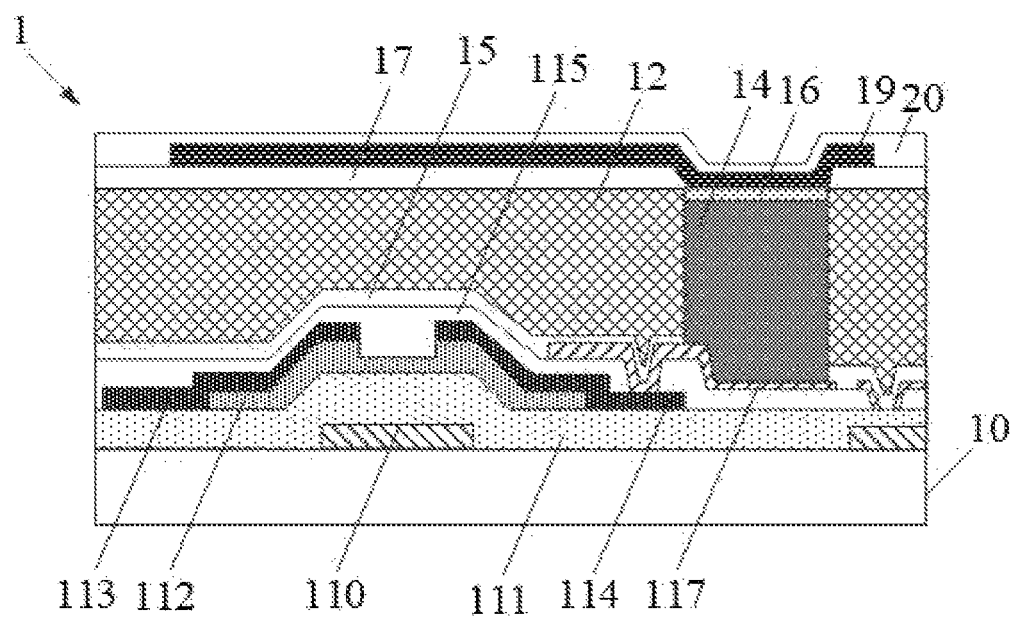

The metal layer 19 is formed to be filled in the third via hole 18 and cover at least a portion of the second passivation layer 17, as shown in FIG. 3H. Specifically, a metal film is formed on a side of the second passivation layer 17 facing away from the base substrate 10 by using a metal material, and then patterned to form the metal layer 19 that includes a portion filled in the third via hole 18 and a portion covering at least a portion of the second passivation layer 17, which are connected to each other. The portion of the metal layer 19 filled in the third via hole 18 is connected to the transparent conductive layer 16, and by applying a voltage to the metal layer 19, the photoelectric conversion device 14 can be driven.

The second insulating layer 20 is formed on a side of the metal layer 19 facing away from the base substrate 10. Specifically, after the metal layer 19 has been formed, the second insulating layer 20 is further formed on the metal layer 19 to cover the metal layer 19, so as to prevent the metal layer 19 from being short-circuited.

Further, after the second insulating layer 20 has been formed, the fourth via hole can be formed in the second insulating layer 20 to allow at least a portion of the metal layer 19 to be exposed. Thereafter, on a side of the second insulating layer facing away from the base substrate 10, a transparent common electrode is formed by a patterning process, which can be electrically connected to the metal layer 19 through the fourth via hole for supplying a common voltage to the metal layer 19.

In addition, an embodiment of the present disclosure further provides a photoelectric detector 1 which is formed by the method provided in the foregoing embodiment. The photoelectric detector 1 includes: the base substrate 10; the thin film transistor array layer 11 disposed on the base substrate 10; the organic layer 12 disposed on a side of the thin film transistor array layer 11 facing away from the base substrate 10, and provided with the first via hole 13 that enables the signal transmission layer 117 in the thin film transistor array layer 11 to be exposed; and the photoelectric conversion device 14 disposed in the first via hole 13.

When the above photoelectric detector 1 is applied to an XRD detection device, the XRD detection device operates as follows.

X-rays in the XRD detection device pass through an object to be detected and onto a scintillator in the XRD detection device so that the scintillator emits light to generate an optical signal, and the photoelectric conversion device 14 included in the XRD detection device then converts the optical signal into an electrical signal and transmits it to the signal transmission layer 117 in the thin film transistor array layer 11, the signal transmission layer 117 further transmits the electrical signal to a chip in the XRD detection device through a thin film transistor, and the chip analyzes the received electrical signal to obtain an image of the object to be detected.

The photoelectric detector 1 provided by the embodiment of the present disclosure is manufactured by the method for manufacturing the photoelectric detector 1 provided by the aforementioned embodiment, in which the photoelectric conversion device 14 is directly deposited in the first via hole 13 of the organic layer 12 in such a manner that the formed photoelectric conversion device 14 can be connected to the signal transmission layer 117 in the thin film transistor array layer 11 and sidewalls of the photoelectric conversion device 14 can be also in direct contact with the walls of the first via hole 13. Therefore, in the photoelectric detector 1 provided by the embodiment of the present disclosure, the first via hole 13 can act to protect the sidewalls of the photoelectric conversion device 14 during the formation of the photoelectric conversion device 14, which not only prevents the by-products generated during the etching process from adhering to the sidewalls of the photoelectric conversion device 14 so as to ensure a low leakage current of the photoelectric conversion device 14, but also solves the problem of the poor uniformity of the photoelectric conversion device 14 due to uneven etching.

Therefore, the photoelectric detector 1 provided by the embodiment of the present disclosure not only has a simple manufacturing process, but also enables the photoelectric conversion device 14 in the manufactured photoelectric detector 14 to have high reliability and good uniformity. If the photoelectric detector 1 provided by the embodiment of the present disclosure is applied to an XRD product, the production yield of the XRD product will be better guaranteed.

Further, the photoelectric conversion device 14 provided in the above embodiment includes a photodiode that includes an N-type semiconductor layer 140, an intrinsic semiconductor layer 141, and a P-type semiconductor layer 142, which are sequentially disposed in a direction perpendicular to the base substrate 10.

Specifically, the photoelectric conversion device 14 provided by the above embodiment may have a variety of structures. By way of example, the photoelectric conversion device 14 may be selected as a PIN photodiode. Since the PIN photodiode has advantages such as relatively low junction capacitance, short transit time, and high sensitivity, the use of a PIN photodiode as the photoelectric conversion device 14 in the photoelectric detector 1 enables an XRD product to have better working performance when the photoelectric detector 1 is applied to the XRD product.

Further, as shown in FIGS. 3D and 3E, the thin film transistor array layer 11 provided by the above embodiment includes a gate layer 110, a first insulating layer 111, a semiconductor layer 112, a source layer 113 and a drain layer 114, a first passivation layer 115, and a signal transmission layer 117, as will be further explained in detail later.

The gate layer 110 is disposed on the base substrate 10. Specifically, the gate layer 110 can be made of a metal material by a patterning process.

The first insulating layer 111 covers the gate layer 110. Specifically, the first insulating layer 111 covers at least the gate layer 110, and can further cover the entire region of the base substrate 10.

The semiconductor layer 112 is disposed on a side of the first insulating layer 111 facing away from the base substrate 10, and has an orthogonal projection on the base substrate 10 that at least partially overlaps an orthogonal projection of the gate layer 110 on the base substrate 10. Specifically, the semiconductor layer 112 may be made of a semiconductor material by a patterning process.

The source layer 113 and the drain layer 114 are disposed on a side of the semiconductor layer 112 facing away from the base substrate 10, and are independent of each other, and wherein each of the source layer and the drain layer covers a portion of the semiconductor layer 112. Specifically, the source layer 113 and the drain layer 114 may be made of a same metal material in a same patterning process.

The first passivation layer 115 is disposed on sides of the source layer 113 and the drain layer 114 facing away from the base substrate 10, and is provided with a second via hole 116 that enables at least a portion of the drain layer 114 to be exposed. Specifically, the second via hole 116 may be formed in the first passivation layer 115 by a patterning process to have an orthogonal projection on the base substrate 10 that partially overlaps an orthogonal projection of the drain layer 114 on the base substrate 10, so that at least a portion of the drain layer 114 can be exposed through the second via hole 116.

The signal transmission layer 117 includes a first portion filled in the second via hole 116 and a second portion located on a side surface of the first passivation layer 115 facing away from the base substrate 10. Specifically, the signal transmission layer 117 can be formed of a metal material and configured to connect a drain electrode in the thin film transistor array layer 11 and the photoelectric conversion device 14.

Further, the photoelectric detector 1 provided by this embodiment further includes: a buffer layer 15, a transparent conductive layer 16, a second passivation layer 17, a metal layer 19, and a second insulating layer 20, as will be further explained in detail later.

The buffer layer 15 is disposed between the thin film transistor array layer 11 and the organic layer 12. Specifically, after the thin film transistor array layer 11 has been formed on the base substrate 10 and before the organic layer 12 is formed, the buffer layer 15 may be formed on the side of the thin film transistor array layer 11 facing away from the base substrate 10, and the organic layer 12 is then formed on a side of the buffer layer 15 facing away from the base substrate 10. By introducing the buffer layer 15 between the thin film transistor array layer 11 and the organic layer 12, a stress between the thin film transistor array layer 11 and the organic layer 12 can be better released, thereby further prolonging the service life of the photoelectric detector 1.

The transparent conductive layer 16 is disposed on a side surface of the photoelectric conversion device 14 facing away from the base substrate 10. Specifically, an indium tin oxide film may be deposited on the side of the photoelectric conversion device 14 facing away from the base substrate 10 by using an indium tin oxide material, and then patterned to form the transparent conductive layer 16.

The second passivation layer 17 covers the organic layer 12 and the transparent conductive layer 16, and is provided with a third via hole 18 that enables the transparent conductive layer 16 to be exposed. Specifically, the second passivation layer 17 covers at least the organic layer 12 and the transparent conductive layer 16, and may further cover the entire region of the base substrate 10. The second passivation layer 17 is patterned by a patterning process to form a third via hole 18 therein, which has an orthogonal projection on the base substrate 10 that at least partially overlaps an orthogonal projection of the transparent conductive layer 16 on the base substrate 10, so that the transparent conductive layer 16 can be exposed through the third via hole 18.

The metal layer 19 is filled in the third via hole 18 and covers at least a portion of the second passivation layer 17. Specifically, a metal film is formed on a side of the second passivation layer 17 facing away from the base substrate 10 by using a metal material, and then patterned to form the metal layer 19, which includes a portion filled in the third via hole 18 and a portion covering at least the portion of the second passivation layer 17, which are connected to each other. The portion of the metal layer 19 filled in the third via hole 18 is connected to the transparent conductive layer 16, and by applying a voltage to the metal layer 19, the photoelectric conversion device 14 is driven.

The second insulating layer 20 is disposed on a side of the metal layer 19 facing away from the base substrate 10. Specifically, after the metal layer 19 has been formed, the second insulating layer 20 is further formed on the metal layer 19 to cover the metal layer 19, so as to prevent the metal layer 19 from being short-circuited.

An embodiment of the present disclosure further provides a detection device including the photoelectric detector provided by the embodiment as described above.

The photoelectric conversion device of the photoelectric detector provided by the embodiment as described above does not need to be formed by a dry-etching process, which prevents the by-products generated during the dry-etching process from adhering to the surface of the photoelectric conversion device, as well as the poor uniformity of the photoelectric conversion device due to uneven etching. Therefore, when incorporating such a photoelectric detector, the detection device provided by the embodiment of the present disclosure not only has a simple manufacturing process but also has high reliability and production yield.

Unless otherwise defined, technical or scientific terms used herein should have same meanings as commonly understood by those having ordinary skills in the art to which the present disclosure pertains. Terms such as "first" and "second" used herein are merely to distinguish different constituent parts rather than to indicate any sequence, number or importance. The terms "comprising", "including" or other variants thereof are intended to mean that the element or item stated before such terms encompasses elements, items listed after these terms and equivalents thereof without excluding other elements or items not expressly listed. The terms "connect", "connected" or the like are not limited to physical or mechanical connection, but may include an electrical connection, either direct or indirect. Such words as "up", "down", "left" and "right" are merely used to represent a relative positional relationship, and when an absolute position of the described object is changed, the relative position relationship will be changed accordingly.

It will be understood that when an element such as a layer, a film, a region or a substrate is referred to as being "on" or "under" another element, it can be directly "on" or "under" the other element, or an intervening element may be present.

In the description of the above embodiments, specific features, structures, materials or characteristics may be combined in any suitable manner in any one or more embodiments or examples.

The above are particular embodiments of the present disclosure only, and the protection scope of the present disclosure is not limited thereto. Variations or substitutions that can be readily envisaged by those skilled in the art without departing from the principle of the present disclosure shall also be encompassed within the protection scope of the present disclosure. The protection scope of the present disclosure shall be defined by the claims as appended here.

What is claimed is:

1. A method for manufacturing a photoelectric detector, comprising:
    forming a thin film transistor (TFT) array layer on a base substrate;
    forming an organic layer on a side of the thin film transistor array layer facing away from the base substrate;
    patterning the organic layer to form a first via hole that enables a signal transmission layer in the thin film transistor array layer to be exposed; and
    forming a photoelectric conversion device in the first via hole by deposition,
    wherein sidewalls of the photoelectric conversion device are in direct contact with walls of the first via hole.

2. The method according to claim 1, wherein when the photoelectric conversion device comprises a photodiode, the forming the photoelectric conversion device in the first via hole comprises:
    depositing an N-type semiconductor film on a side of the organic layer facing away from the base substrate, and patterning the N-type semiconductor film to obtain an N-type semiconductor layer located in the first via hole;
    depositing an intrinsic semiconductor film on a side of the N-type semiconductor layer facing away from the base substrate, and patterning the intrinsic semiconductor film to obtain an intrinsic semiconductor layer located in the first via hole; and
    depositing a P-type semiconductor film on a side of the intrinsic semiconductor layer facing away from the base substrate, and patterning the P-type semiconductor film to obtain a P-type semiconductor layer located in the first via hole.

3. The method according to claim 1, wherein the forming the thin film transistor array layer on the base substrate comprises:
    forming a gate layer on the base substrate;
    depositing a first insulating layer on a side of the gate layer facing away from the base substrate to cover the gate layer;
    forming, on a side of the first insulating layer facing away from the base substrate, a semiconductor layer having an orthogonal projection on the base substrate, which at least partially overlaps an orthogonal projection of the gate layer on the base substrate;

forming, on a side of the semiconductor layer facing away from the base substrate, a source layer and a drain layer which are independent of each other, and wherein each of the source layer and the drain layer covers a portion of the semiconductor layer;

forming a first passivation layer that completely covers the source layer, the drain layer, and an exposed portion of the semiconductor layer;

patterning the first passivation layer to form a second via hole which enables at least a portion of the drain layer to be exposed; and forming a signal transmission layer which comprises a first portion filled in the second via hole and a second portion on a side surface of the first passivation layer facing away from the base substrate.

4. The method according to claim 1, wherein prior to the forming the organic layer, the method further comprises:
forming a buffer layer on the side of the thin film transistor array layer facing away from the base substrate.

5. The method according to claim 4, wherein the forming the organic layer on the side of the thin film transistor array layer facing away from the base substrate comprises:
forming the organic layer on a side of the buffer layer facing away from the base substrate.

6. The method according to claim 1, wherein after the photoelectric conversion device has been formed, the method further comprises:
forming a transparent conductive layer on a side surface of the photoelectric conversion device facing away from the base substrate;
forming a second passivation layer covering the organic layer and the transparent conductive layer;
patterning the second passivation layer to form a third via hole which enables the transparent conductive layer to be exposed;
forming a metal layer filled in the third via hole and covering at least a portion of the second passivation layer; and
forming a second insulating layer on a side of the metal layer facing away from the base substrate.

7. The method according to claim 6, wherein the forming the transparent conductive layer on the side surface of the photoelectric conversion device facing away from the base substrate comprises:
depositing an indium tin oxide (ITO) thin film on the side surface of the photoelectric conversion device facing away from the base substrate by using an indium tin oxide material.

8. The method according to claim 6, wherein after the second insulating layer has been formed, the method further comprises:
forming a fourth via hole in the second insulating layer, which enables at least a portion of the metal layer to be exposed; and
forming, by a patterning process on a side of the second insulating layer facing away from the base substrate, a transparent common electrode which is electrically connectable to the metal layer through the fourth via hole for supplying a common voltage to the metal layer.

9. A photoelectric detector, comprising:
a base substrate;
a thin film transistor array layer disposed on the base substrate;

an organic layer, disposed on a side of the thin film transistor array layer facing away from the base substrate, and provided with a first via hole which enables a signal transmission layer in the thin film transistor array layer to be exposed; and
a photoelectric conversion device disposed in the first via hole,
wherein sidewalls of the photoelectric conversion device are in direct contact with.

10. The photoelectric detector according to claim 9, wherein the photoelectric conversion device comprises a photodiode, which comprises an N-type semiconductor layer, an intrinsic semiconductor layer and a P-type semiconductor layer sequentially disposed in a direction perpendicular to the base substrate.

11. The photoelectric detector according to claim 10, wherein the photodiode is a PIN photodiode.

12. The photoelectric detector according to claim 9, wherein the thin film transistor array layer comprises:
a gate layer disposed on the base substrate;
a first insulating layer covering the gate layer;
a semiconductor layer disposed on a side of the first insulating layer facing away from the base substrate, and having an orthogonal projection on the base substrate, which at least partially overlaps an orthogonal projection of the gate layer on the base substrate;
a source layer and a drain layer disposed on a side of the semiconductor layer facing away from the base substrate, the source layer and the drain layer being independent of each other, and wherein each of the source layer and the drain layer covers a portion of the semiconductor layer;
a first passivation layer disposed on sides of the source layer and the drain layer facing away from the base substrate, and provided with a second via hole which enables at least a portion of the drain layer to be exposed; and
a signal transmission layer comprising a first portion filled in the second via hole and a second portion located on a side surface of the first passivation layer facing away from the base substrate.

13. The photoelectric detector according to claim 12, wherein the first insulating layer covers at least the gate layer.

14. The photoelectric detector according to claim 12, wherein the first insulating layer covers an entire region of the base substrate.

15. The photoelectric detector according to claim 12, wherein the first passivation layer covers at least the source layer, the drain layer, and the semiconductor layer.

16. The photoelectric detector according to claim 12, wherein the first passivation layer covers an entire region of the base substrate.

17. The photoelectric detector according to claim 9, further comprising:
a buffer layer disposed between the thin film transistor array layer and the organic layer;
a transparent conductive layer disposed on a side surface of the photoelectric conversion device facing away from the base substrate;
a second passivation layer covering the organic layer and the transparent conductive layer, and provided with a third via hole which enables the transparent conductive layer to be exposed;
a metal layer filled in the third via hole and covering at least a portion of the second passivation layer; and a second insulating layer disposed on a side of the metal layer facing away from the base substrate.

18. A detection device, comprising the photoelectric detector as claimed in claim 9.

19. The detection device according to claim 18, wherein the detection device is an X-ray diffraction (XRD) detection device.

20. The detection device according to claim 19, wherein the XRD detection device comprises:
an X-ray emitting device, configured to emit X-rays;
a chip, configured to analyze a received electrical signal to obtain an image of an object to be detected; and
a scintillator, configured to receive the X-rays which have passed through the object to be detected in the XRD detection device,
wherein the X-rays in the XRD detection device pass through the object to be detected and onto the scintillator in the XRD detection device so that the scintillator emits light to generate an optical signal, and the photoelectric conversion device included in the XRD detection device then converts the optical signal into an electrical signal and transmits the electrical signal to the signal transmission layer in the thin film transistor array layer included in the XRD detection device, the signal transmission layer further transmits the electrical signal to the chip in the XRD detection device through a thin film transistor, and the chip analyzes the received electrical signal to obtain the image of the object to be detected.

* * * * *